United States Patent [19]
Beasom

[11] Patent Number: 4,823,173
[45] Date of Patent: Apr. 18, 1989

[54] HIGH VOLTAGE LATERAL MOS STRUCTURE WITH DEPLETED TOP GATE REGION

[75] Inventor: James D. Beasom, Melbourne Village, Fla.

[73] Assignee: Harris Corporation, Melbourne, Fla.

[21] Appl. No.: 831,384

[22] Filed: Jan. 7, 1986

[51] Int. Cl.[4] .......................................... H01L 29/80
[52] U.S. Cl. .................................... 357/22; 357/23.8; 357/35
[58] Field of Search ................ 357/23.8, 22 E, 22 F, 357/22 G, 35

[56] References Cited

U.S. PATENT DOCUMENTS

| | | | |
|---|---|---|---|
| 4,270,137 | 5/1981 | Coe | 357/23.4 |
| 4,300,150 | 11/1981 | Colak | 357/13 |
| 4,344,080 | 8/1982 | Tihanyi | 357/23.8 |
| 4,394,674 | 7/1983 | Sakuma et al. | 357/23.8 |
| 4,409,606 | 10/1983 | Wagenaar et al. | 357/23.8 |
| 4,422,089 | 12/1983 | Vaes et al. | 357/22 F |
| 4,485,392 | 11/1984 | Singer | 357/22 F |

OTHER PUBLICATIONS

H. Vaes et al., "High-Voltage, High Current Lateral Devices", 1980 IEDM Conf. Proc., Dec. 8-10, 1980, pp. 87-90.

Primary Examiner—Joseph E. Clawson, Jr.
Attorney, Agent, or Firm—William A. Troner; Charles C. Krawczyk

[57] ABSTRACT

The present invention provides an improved lateral drift region for both bipolar and MOS devices where improved breakdown voltage and low ON resistance are desired. A top gate of the same conductivity type as the device region with which it is associated is provided along the surface of the substrate and overlying the lateral drift region. In an MOS device, the extremity of the lateral drift region curves up to the substrate surface beyond the extremity of the top gate to thereby provide contact between the JFET channel and the MOS channel.

19 Claims, 3 Drawing Sheets

HIGH VOLTAGE LATERAL MOS STRUCTURE WITH DEPLETED TOP GATE REGION

FIELD OF THE INVENTION

The present invention relates to lateral semiconductor devices and an improved method of making lateral semiconductor devices. More specifically, the invention relates to high voltage lateral devices with reduced ON resistance and a method of making such devices.

Previous high voltage lateral devices include both MOS devices and bipolar transistors. For example, FIG. 1 illustrates a known structure which can be used as a high voltage lateral MOS device. This device is known as a lateral drift region MOS device and is dependent upon the drain body junction 15 as the basic high voltage junction of the device. The drift region 17 is a P region along the top surface of the $N^{31}$ substrate 11 and is located so as to lie adjacent the P− drain region 12. The drift region 17 is used to connect the high voltage drain 12 to the gate 16 and source 14. The two contacts, drain contact $12_a$ and body contact $11_c$ are shown for completeness. In the operation of this circuit, the gate 16 and source 14 never assume large voltages relative to the body 11. The drift region 17 serves as a JFET channel with the portion $11_a$ of body region 11 underlying the channel acting as a JFET gate. The JFET channel 17 is designed to totally deplete when the drain 12 is reverse biased to a voltage less than the voltage necessary to reach critical field in the channel to body depletion layer. This design preserves the effective high breakdown voltage of drain body junction 15. Also, the source 14 and gate 16 (over the gate oxide 13) are safely shielded from the high drain body voltage by the pinched off JFET channel 17.

The resistance of the lateral drift region JFET channel 17 is in series with the resistance of the MOS channel $11_b$, consequently the total channel resistance of the device is the sum of these two individual resistances. The JFET channel, which must be quite long to sustain high drain body voltages, is often the larger of the two resistance terms. Thus it is desirable to find ways to reduce the resistance of the drift region so that devices of a given size can be made with smaller channel resistance.

FIG. 2 shows a known structure which can be used as a lateral bipolar transistor. Another illustration of such a device is contained in FIG. 7 of U.S. Pat. No. 4,283,236 issued Aug. 11, 1981. Referring to FIG. 2, an N− substrate 11, has an N type emitter shield 121 formed therein and P+ emitter 122 and collector 124 located as shown. Additionally, a P− drift region 123 is provided along the surface of the substrate between the collector 124 and the emitter shield 121. In this device, the total collector resistance is equal to the sum of the resistance across the drift region 125 plus the resistance of the P+ collector between the drift region and the collector contact. In order to provide devices of equal size having a lower collector resistance, it is desirable to find ways to reduce the resistance of the drift region.

In the operation of this device, the drift region extends the collector to the edge of the emitter shield, 121, so that the base width is just that small distance between the adjacent edges of the emitter, 121, and the drift region, therefore providing improved frequency response.

At high base collector voltages the drift region, 123, depletes by JFET action with the N-base, 11, and N shield, 121, which is part of the base, acting as gate before critical field is reached just as for the MOS of FIG. 1. This preserves the high breakdown of the structure.

SUMMARY OF THE INVENTION

The present invention provides a structure having a reduced channel resistance and a process capable of efficiently obtaining the structure of the invention. The reduction in channel resistance is accomplished by providing a top gate which is located between the lateral drift region of the prior art and the surface of the channel region and which may be in contact with the high voltage device region. This top gate allows the total channel doping to be increased because the top gate to channel depletion layer holds some additional channel charge when reverse biased in addition to that held by the bottom gate to channel depletion layer of the prior art structure. The ionized channel impurity atoms associated with this additional channel charge causes the reduction in channel resistance.

DETAILED DESCRIPTION OF THE INVENTION

Figure 3:
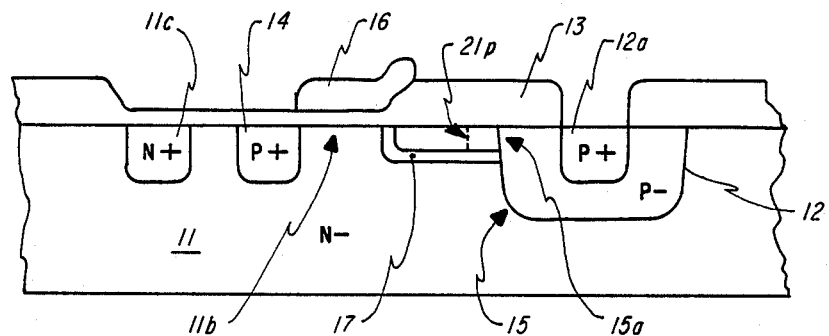
FIG. 3 is a cross section of an MOS device including the improved drift region and top gate of the invention.

The present invention is described herein with reference to the drawings for both MOS and bipolar applications. FIG. 3 shows an MOS device where P+ drain contact $12a$ is formed in P− type drain 12, P+ source 14 is formed in the N− body 11 and N+ body contact $11_c$ is provided in the N− body 11. The MOS channel region $11_b$ is in the N− body 11 below the MOS gate 16. The N type top gate 21 is provided along the surface $11_s$ of the body 11 above the P type drift region 17 which acts as a JFET channel. The lateral edge or peripheral edge of both the top gate 21 and drift region 17 extend to the drain body junction 15 and preferably terminate at the junction 15. It is noted that situations may exist where the doping level in the top gate may be sufficiently high so as to render it desirable to provide a shorter top gate having a lateral extension which stops short of contacting the junction 15. In this case care should be taken to insure that any non-depleted portion of the top gate does not result in a breakdown of the top gate to drift region junction. Proper doping of the top gate will generally be a sufficient preventative step. Dashed line $21_p$ designates the peripheral edge of top gate 21 in an embodiment where the top gate does not extend all the way to the junction 15.

Figure 1:
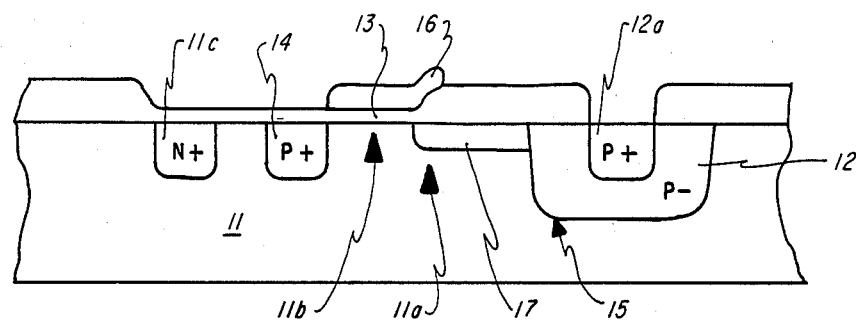
FIG. 1 is a cross section of a known MOS device having typical ON resistance.

The structure of FIG. 3 provides reduced ON resistance in the JFET channel relative to the prior art lateral drift MOS device as shown in FIG. 1. The reduction in ON resistance is accomplished by providing a structure which can accommodate increased drift region doping without suffering from reduced body to drain breakdown. This is possible because of the provision of the top gate 21. The top gate to channel depletion layer which holds some channel charge when reverse biased, is in addition to the channel charge held by the bottom gate to channel depletion layer of the prior art. This additional channel charge, in the form of ionized channel impurity atoms, results in the reduction in channel resistance. It is possible to provide more than twice the doping level previously acceptable due to the additional ability to hold channel change. Thus, for a drift region having a doping of $1 \times 10^{12}$ boron atoms per square centimeter over the drift region surface in a bottom gate arrangement, the present invention will permit $2 \times 10^{12}$ boron atoms per square centimeter. Thus, the ON resistance will be only half the ON resistance of the prior arrangement.

In order to optimize performance of the structure of the invention, the top gate 21 must be designed differently than an ordinary JFET gate. Top gate 21 should become totally depleted at a body to drain voltage of less than the breakdown voltage of the top gate to drain junction $15_a$. Since top gate 21 is connected to body 11, the voltage at the top gate to drain junction $15_a$ will equal the voltage of the body to drain junction 15 voltage and the top gate to drain breakdown voltage should be greater than the voltage at which top gate 21 becomes totally depleted. Additionally, the top gate 21 should totally deplete before the body 11 to channel 17 depletion layer reaches the top gate 21 to channel 17 depletion layer to thereby assure that a large top gate 17 to drain 12 voltage is not developed by punch-through action from the body 11. An ordinary JFET gate never totally depletes regardless of operating conditions.

Figure 4:
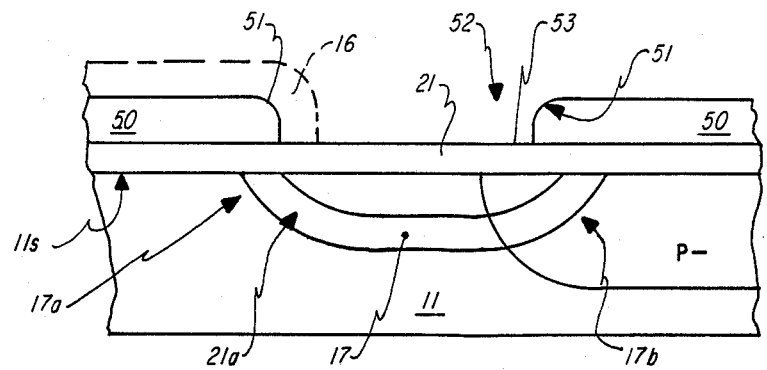
FIG. 4 illustrates optimized process steps for obtaining the desired shape of the top gate and drift region of the invention.
Figure 5A:
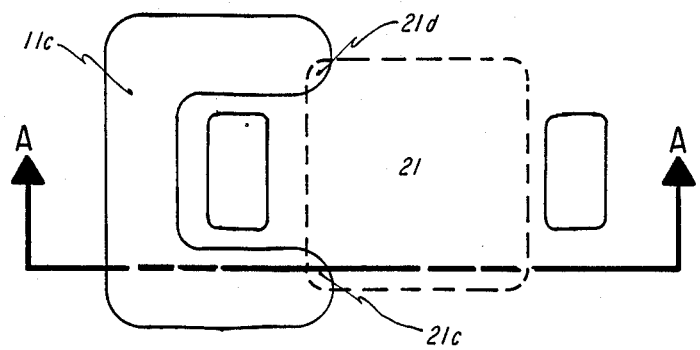
FIGS. 5a and 5b are respectively a top view and is a cutaway perspective view of the body contact extending through the top gate and drift region of the invention.
Figure 5B:
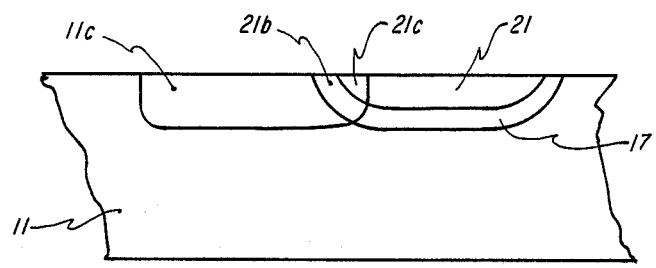

In addition to the above described characteristics of the device of the invention, it is also desirable to insure that the channel of the JFET drift region contacts the inversion layer MOS surface channel. This can be accomplished as shown in FIG. 4 where an implant mask 50 having a tapered edge 51 is provided over the body 11. An implant aperture 52 is provided in mask 50 at the location where the P drift region 17 and top gate 21 are to be formed. The aperture 52 is shown as exposing the protective oxide 53. Ion implantation is not substantially effected by the oxide 53 due to the oxide thickness of only about 0.1–0.2 micrometers, yet the oxide provides surface passivation for the underlying body 11.

The drift region 17 is ion implanted and because of the graduated thickness of the implant mask 50 (along the edge 51) the depth of the implanted drift region 17 is graduated or tapered. In the illustration, a fairly good rounding of the drift region 17 occurs at the peripheral edges or extremities $17_a$, $17_b$ of the region 17. The curved extremity $17_a$ is of interest because at this location the channel of the JFET drift region 17 contacts the surface $11_s$ of body 11 beyond the end $21_a$ of top gate 21 and is desirably beneath the gate 16 of the MOS device. The top gate 21 may be ion implanted into the drift region using the implant mask 50 but at an energy level which results in a shallower ion penetration. This tapered profile, particularly if curved, provides improved performance.

In a variation of this method a diffusion process can be used to bring the JFET channel into contact with the surface $11_s$ of body 11, and hence insure that the JFET channel will contact the inversion layer MOS surface channel. The lateral drift region 17 and top gate 21 are diffused into the body 11 after initial introduction by ion implant. The doping levels and diffusion times are chosen such that the extremity $17_a$ of drift region 17 diffuses beyond the end $21_a$ of the top gate 21 and so that the end $17_a$ reaches the surface $11_s$ of body 11. In practice, this approach can be facilitated by choosing a top gate dopant which has a lower diffusion coefficient than that of the drift region dopant.

The formation of the drift region and top gate may be conveniently carried out by forming a mask over the gate oxide which is present in a lateral MOS application. The MOS gate may be utilized as one delineating edge of the implant for the drift region and top gate and a thick oxide portion surrounding a thinner oxide portion may form the remainder of the implant mask. The thinner oxide portion shall be located such that it extends from beneath the MOS gate to the drain and preferably overlaps the drain. The implant mask 50 illustrated in FIG. 4 is shown as having thin oxide portion 53 being surrounded by the implant mask 50. If the MOS gate 16 shown in dashed lines were used as a portion of the mask 50, the edge of the drift region and top gate would be self aligned with the MOS gate as shown in dashed lines. Then, when diffused, the drift region will extend laterally to a point beneath the MOS gate while the top gate may be formed such that there is little or no lateral overlap with the MOS gate. The extent of lateral diffusion of the top gate is dependent upon the dopant material and processing temperatures following top gate implant. It is noted that there is a separation between the drift region and the source. This separation zone is the location where the MOS channel is located.

The top gate 21 will perform as previously described if it is tied to the body 11. Thus, the top gate 21 and the body which operates as the bottom gate of the JFET channel will be at equal potential. According to the invention, this may be accomplished in a particularly effective manner if the drift region 17 is widened to overlap with the body contact region $11_c$. This is shown in FIG. $5_a$ which shows the overlapping of the top gate 21 and the body contact $11_c$ at overlap regions $21_c$, $21_d$. In order for this arrangement to be effective, it is necessary that the body contact $11_c$ have a higher dopant concentration than the JFET channel (or drift region) 17 as shown in FIG. $5_b$ to insure that the body contact $11_c$ forms a continuous region horizontally and/or vertically through the JFET channel and to the body region 11 from the top gate, 21.

FIG. $5_b$ shows a cross section of the structure of FIG. $5_a$ taken along dashed line A—A. The body 11 is provided with body contact $11_c$ which is located such that the top gate 21 and drift region 17 can be conveniently extended to overlap the body contact $11_c$. The depth of body contact $11_c$ may be made greater than the depth of region 17 such that a portion of the body contact $11_c$ extends below region 17 and provides contact with the body 11. This arrangement provides a contact portion $21_c$ where the top gate 21 is in contact with body contact $11_c$. Thus, so long as the body contact doping concentration in region $21_b$ is sufficiently high to overcome the opposite doping in region 17, then a good connection of uniform conductivity type will be provided between the top gate 21 and the body 11. It is also noted that the body contact $11_c$ extends laterally beyond the end of both of the top gate 21 and the drift region 17. The lateral extension of the contact $11_c$ will also provide a structure which results in a good connection of uniform conductivity-type from the top gate 21 to the body 11, again, provided that the doping of body contact $11_c$ converts region $21_b$.

Figure 2:
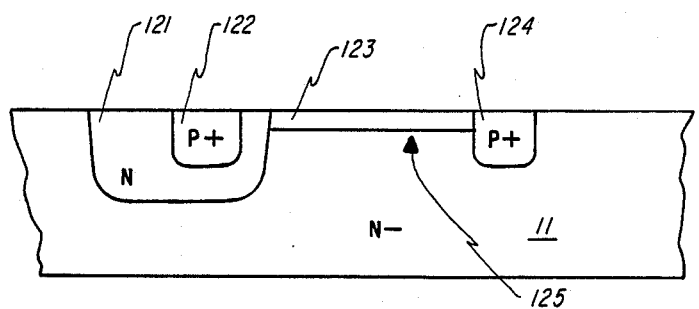
FIG. 2 is a cross section of a known bipolar transistor having typical collector resistance.
Figure 6:
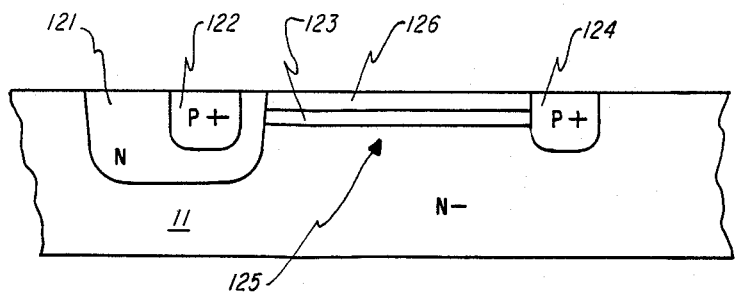
FIG. 6 is a cross section of a bipolar device made in accordance with one aspect of the invention.

Another area where the present invention finds application is in lateral bipolar transistors which employ a lateral drift region. The known structure of FIG. 2 may be improved by providing an N type top gate 126 as shown in FIG. 6. In this arrangement the top gate 126 extends from the collector 124 to the emitter shield 121 along the surface of body 11. The operation of this device is enhanced by the same phenomenon as the lateral drift region of the previously described MOS device. As the base 11 becomes positive relative to the collector 124, the top gate to drift region depletion layer facilitates pinch-off of the drift region. However, as the base 11 becomes more negative the top gate 126 contributes additional surface exposure to the drift region 123 resulting in lower collector resistance.

Figure 7:
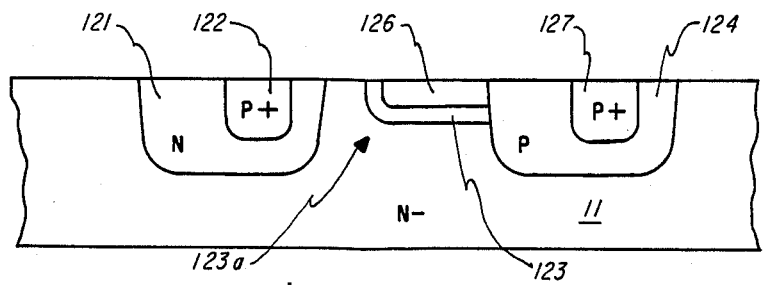
FIG. 7 is a cross section of a bipolar device made in accordance with another aspect of the invention.

FIG. 7 shows an improvement over the arrangement shown in FIG. 6. In FIG. 7 the drift region 123 does not extend all the way over to the emitter shield 121. The curved end $123_a$ of the drift region 123 contacts the top surface of body 11. It is noted that in this arrangement, the emitter shield 121 may be omitted.

An additional improvement shown in FIG. 7 is the use of a deep diffusion to form the collector 124 resulting in a significantly increased breakdown voltage. The deep diffusion step may be the same step used for forming the emitter, in which case the collector 124 shown in FIG. 6 would be deeper, or a separate collector implant and diffusion step may be employed and the collector contact 127 may then be formed simultaneously with the formation of the emitter 122. This improvement in junction breakdown voltage is equally obtainable, for example, at the body to drain junction in the MOS devices described previously.

Figure 8:
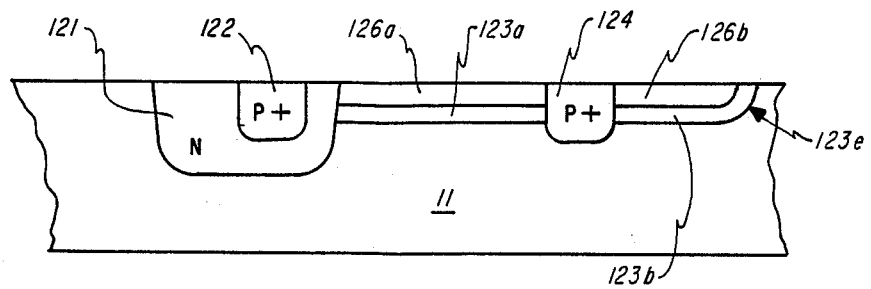
FIG. 8 is a cross section of a bipolar device made in accordance with a preferred aspect of the invention.

A further extension of the invention which may be used to increase base to collector breakdown voltage for a PNP device is shown in FIG. 8. In addition to the provision of the N type top gate $126_a$ over the P− drift region $123_a$, the top gate and drift region are enlarged to surround the collector 124 and a curved edge $123_e$ is provided at the periphery of the enlarged portion $123_b$ of the drift region. This enlarged portion is designated by reference numerals $123_b$ for the drift region and $126_b$ for the top gate. The collector 124 to base 11 breakdown voltage is increased relative to alternative arrangements because of mitigation of the breakdown reduction due to the junction curvature. The top gate $126_a$ extends to the emitter shield 121 as does the drift region $123_a$. The P+ emitter 122 is formed in the N+ type emitter shield.

Figure 9:
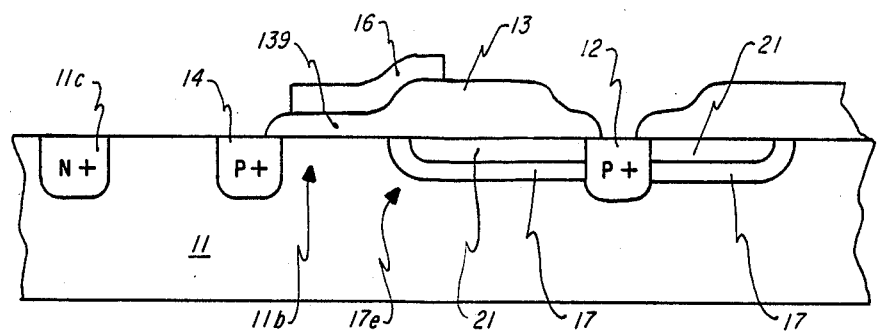
FIG. 9 is a cross section of an MOS device, including the lateral drift region and top gate of the invention, in a preferred embodiment.

FIG. 9 illustrates an extension of the invention with respect to a P channel MOS device similar to the improvement described with respect to the bipolar device shown in FIG. 8. For the MOS device, the P+ drain 12 is surrounded by the P− drift region 17 and N type top gate 21. Around the entire periphery of the drift region there is a curved portion $17_e$ which rounds up to the surface of the N− substrate 11 to insure that the JFET channel in the drift region 17 contacts the MOS channel $11_b$ under the MOS gate 16. The drift region 17 extends outward from the entire perimeter of the drain 12. This arrangement mitigates the breakdown reduction due to junction curvature. The P+ source 14 and N+ body contact $11_c$ are shown as is the dielectric 13 which serves as the gate oxide $13_g$ beneath the MOS gate 16.

In both the arrangements shown in FIG. 8 and FIG. 9, the planar diode breakdown improvement created by the drift region acting as a surface layer of the same conductivity type as the collector in FIG. 8 and drain in FIG. 9 and extending out from the perimeter of the collector and drain can be implemented by a single series of process steps. According to the invention, a common set of process steps produces both a suitable breakdown improvement layer and an improved drift region. The breakdown improvement layer is a two layer component.

While the present invention has been described with respect to several preferred manners of implementing the invention, it is to be understood that the claims appended hereto are intended to cover the invention in its broadest sense and are not to be limited to the specific implementations disclosed.

What is claimed is:

1. In a semiconductor device of the type including a lateral drift region of a first conductivity type formed in a body region, said drift region serving as a JFET channel, the improvement comprising:

a top gate of a semiconductor material electrically connected to said body region and having a second conductivity type over said drift region to cause depletion of said drift region rom the top upon application of a reverse bias voltage to said device, wherein said top gate laterally abuts a device region to form a junction and has a surface area doping density such that said top gate becomes totally depleted at a reverse bias voltage below the reverse breakdown voltage of the top gate to device region junction, and wherein said top gate has a surface are a doping density such that it becomes totally depleted at a reverse bias voltage less than the reverse bias voltage at which said drift region becomes depleted.

2. A semiconductor device as claim 1 wherein said drift region as a tapered peripheral edge.

3. A semiconductor device as claimed in claim 2 wherein said top gate has a lateral expanse bounded by said drift region.

4. A semiconductor device as claimed in claim 3 wherein said top gate has a tapered peripheral edge.

5. A semicondcutor device comprising:

a semiconductor body of a first conductivity type;

a first device region of a second conductivity type formed in said body;

a second device region of said second conductivity type formed in said body and separated from said first device region;

a drift region of said second conductivity type formed in said body between said first and second device regions, separated from said second device region by a separation zone and in contact with said first device region, said drift region having a first side adjacent said body;

a top gate of said first conductivity type adjacent a substantial portion of a second side of said drift region and electrically connected to said body;

wherein said top gate and semiconductor body operable as a top and bottom gate respectively of a JFET channel formed by said drift region;

said top gate having a surface area doping density such that it becomes totally depleted at a body to first device region voltage below the voltage at which the body to drift region depletion layer in said first side of said drift region reaches the top gate to drift region depletion layer in said second side of said drift region.

6. A semiconductor device as claimed in claim 5 wherein said first device region is a drain of a lateral drift region MOS device;

said semiconductor device further comprising an MOS gate located over said separation zone and overlapping a portion of said drift region.

7. A semiconductor device as claimed in claim 5 wherein said first device region is a collector of a lateral bipolar transistor and wherein said separation zone comprises an emitter shield region of said first conductivity type.

8. A semiconductor device as claimed in claim 5 wherein said drift region and top gate are in contact with said first device region about the entire periphery of said first device region.

9. A lateral MOS structure comprising a semiconductor body of a first conductivity type, source and drain regions of a second conductivity type forming respective source and drain junctions with said body, and a drift region of said second conductivity type, said drift region forming a JFET channel in said body controlled by said semiconductor body which body operates as a JFET gate such that upon application of a reverse bias to said body to drain junction said drift regions becomes depleted, and a top gate of said first conductivity type formed in said drift region and being electrically connected to said body, said top gate having a surface area doping density such that it becomes totally depleted below a body to drain voltage at which said drift region becomes depleted.

10. A lateral MOS structure as claimed in claim 9 wherein:
said top gate is laterally spaced from said drain.

11. A lateral MOS structure as claimed in claim 9 wherein:
a body contact of said first conductivity type is formed in said body and said top gate overlaps said body contact, said body contact having an impurity concentration higher than the impurity concentration of said drift region.

12. A lateral MOS structure as claimed in claim 9 wherein:
said drift region and said top gate extend laterally around the entire surface intersection of the drain to body junction to reduce the surface field and thereby increase breakdown voltage of the drain to body junction.

13. A lateral MOS structure as claimed in claim 9 wherein:
said top gate totally depletes below a body to drain voltage at which said drift region totally depletes.

14. A lateral MOS structure as claimed in claim 9 wherein:
said top gate is formed by an ion implant, and said top gate has a tapered peripheral edge.

15. A lateral MOS structure as claimed in claim 14 wherein:
said drift region is formed by an ion implant and said drift region has a tapered peripheral edge.

16. A diode structure comprising:
a first semiconductor body of a first conductivity type contained within a semiconductor region of a second conductivity type and forming a diode junction therewith, said semiconductor region having a first dopant concentration, a second body of said first conductivity type contained within said semiconductor region and having a second dopant concentration greater than said first dopant concentration, said second body surrounding the lateral perimeter of said first body and abutting said first body;

said second body forming a JFET channel controlled by said semiconductor region which region operates as a JFET gate such that upon application of a reverse bias to said region to first body junction said second body becomes depleted, and a top gate of said second conductivity type formed within said second body and being electrically connected to said first semiconductor region, said top gate having a dopant concentration such that upon application of said reverse bias, said top gate becomes totally depleted before said second body becomes depleted.

17. In a diode structure as claimed in claim 16, the improvement comprising:
a tapered peripheral edge for said top gate.

18. In a diode structure as claimed in claim 17, the improvement comprising:
forming said tapered peripheral edge by implanting said top gate using an implant mask with a tapered edge.

19. In a diode structure as claimed in claim 16, the improvement comprising:
forming a tapered peripheral edge for said second body by implanting said second body using an implant mask with a tapered edge.

* * * * *